(12) United States Patent
Yu et al.

(10) Patent No.: US 6,468,874 B1
(45) Date of Patent: Oct. 22, 2002

(54) METHOD OF MANUFACTURING A CAPACITOR IN A SEMICONDUCTOR DEVICE

(75) Inventors: Yong Sik Yu; Kweon Hong, both of Sungnam-Shi (KR)

(73) Assignee: Hyundai Electronic Industries Co., Ltd., Ichon-Shi (KR)

( * ) Notice: Subject to any disclaimer, the term of this patent is extended or adjusted under 35 U.S.C. 154(b) by 0 days.

(21) Appl. No.: 09/722,357

(22) Filed: Nov. 28, 2000

(30) Foreign Application Priority Data

Dec. 27, 1999 (KR) ............................................. 99-62961

(51) Int. Cl.⁷ ............................................. H01L 21/20
(52) U.S. Cl. ........................ 438/396; 438/253; 438/255; 438/399
(58) Field of Search ................................ 438/396, 397, 438/398, 399, 253, 255

(56) References Cited

U.S. PATENT DOCUMENTS

| | | |
|---|---|---|
| 4,397,077 A | 8/1983 | Derbenwick et al. |
| 4,895,520 A | 1/1990 | Berg |
| 5,106,776 A | 4/1992 | Shen et al. |
| 5,219,778 A | 6/1993 | Dennison et al. |
| 5,298,436 A | 3/1994 | Radosevich et al. |
| 5,300,450 A | 4/1994 | Shen et al. |
| 5,352,630 A * | 10/1994 | Kim et al. .................. 437/195 |
| 5,405,796 A | 4/1995 | Jones, Jr. |
| 5,716,875 A | 2/1998 | Jones, Jr. et al. |
| 5,907,780 A | 5/1999 | Gilmer et al. |
| 5,923,056 A | 7/1999 | Lee et al. |
| 5,960,270 A | 9/1999 | Misra et al. |
| 6,010,927 A | 1/2000 | Jones, Jr. et al. |
| 6,066,525 A | 5/2000 | Liu et al. |
| 6,077,420 A * | 8/2000 | Chen et al. .................. 438/255 |
| 6,153,490 A * | 11/2000 | Xing et al. .................. 438/396 |
| 6,319,766 B1 * | 11/2001 | Bakli et al. .................. 438/240 |
| 6,326,258 B1 * | 12/2001 | Iizuka ........................ 438/239 |

FOREIGN PATENT DOCUMENTS

JP  62-204567  9/1987

\* cited by examiner

Primary Examiner—Carl Whitehead, Jr.
Assistant Examiner—Volita Russell
(74) Attorney, Agent, or Firm—Finnegan, Henderson, Farabow, Garrett & Dunner, L.L.P.

(57) ABSTRACT

There is disclosed a method of manufacturing a capacitor in a semiconductor device. In order to solve the problems that it is difficult to secure an effective surface area and a misalignment between a capacitor plug and an underlying electrode occurs in a capacitor having a stack structure using a BST dielectric film, the present invention forms a contact layer and a diffusion prevention film within a first contact hole for plug in a plug shape, forms a second contact hole using an oxide film, deposits an underlying electrode material and then removes the oxide film to form an underlying electrode. Therefore, the present invention has outstanding advantages of increasing the effective surface area of an underlying electrode since a process of etching the underlying electrode which could not be etched easily can be omitted, and preventing diffusion of oxygen upon formation of a dielectric thin film since a direct contact of a metal/oxygen diffusion prevention film and the dielectric film can be avoided. As a result, the present invention can improve an electrical characteristic of a capacitor.

9 Claims, 3 Drawing Sheets

METHOD OF MANUFACTURING A CAPACITOR IN A SEMICONDUCTOR DEVICE

CROSS-REFERENCE TO RELATED APPLICATION

Priority is claimed from Republic of Korean patent application No. 99-62961 filed Dec. 27, 1999, which is incorporated in its entirety by reference.

BACKGROUND OF THE INVENTION

1. Field of the Invention

The invention relates generally to a method of manufacturing a capacitor in a semiconductor device. More particularly, the present invention relates to a method of manufacturing a capacitor in a semiconductor device that can prevent soft error, maintain a stable operation and has a good leakage current characteristic in a DRAM.

2. Description of the Prior Art

A manufacturing technology for a semiconductor device necessarily involves research on improving the performances of a transistor and a capacitor. Particularly, in order to prevent soft error and maintain a stable operation in a DRAM, a capacitance of more than 25fF per unit cell is required and the leakage current must be sufficiently low. As a dielectric such as the existing $Si_3N_4/SiO_2$ (NO) or $Ta_2O_5$ has an insufficient dielectric constant, however, research into a high dielectric such as $SrTiO_3$ and (Ba, Sr) $TiO_3$ (Barium Strontium Titanate; hereinafter called "BST") has been actively progressed as a capacitor having a high dielectric constant in Giga DRAM. At the same time, research into an underlying electrode for a storage node also has been actively progressed.

A conventional method of manufacturing a capacitor using high dielectric constant consisted of material thin films such as $SrTiO_3$ and BST having high dielectric constant will be explained by reference to FIGS. 1 and 2.

FIG. 1 is a cross-sectional view of a device for explaining a method of manufacturing a capacitor in a semiconductor device according to a first conventional method.

As shown, a first interlayer insulating film 12 and a second interlayer insulating film 13 are sequentially formed on a substrate 11 in which an underlying structure is formed. Then, for a vertical wiring of the substrate 11 and a capacitor, a selected region of the second and first interlayer insulating films 13 and 12 are etched to form a contact hole. Next, the contact hole is buried with polysilicon and is flatten to form a capacitor plug 14. Thereafter, a contact layer 15 and a diffusion prevention film 16 are formed on the entire structure. After an underlying material is formed on the diffusion prevention film 16, the underlying electrode material, the diffusion prevention film 16 and the contact layer 15 are patterned to form an underlying electrode 17. Next, a dielectric film 18 and an upper electrode 19 are formed on the entire structure using BST, thereby completing manufacturing a capacitor.

However, in the above mentioned method, as the design rule of a semiconductor device is smaller, angle of more than 80° must be maintained at a given height of the underlying electrode 17. However, there is a problem that angle of a given degree could not be maintained due to difficulty in a process etching. Also, when the dielectric film 18 is formed, there is a problem that the contact layer 15 and the diffusion prevention film 16 at the side surface of the underlying electrode are exposed.

FIG. 2 is a cross-sectional view of a device for explaining a method of manufacturing a capacitor in a semiconductor device according to a second conventional method.

As shown, after a first interlayer insulating film 22 and a second interlayer insulating film 23 are sequentially formed on a semiconductor substrate 21 in which an underlying structure is formed, for a vertical wiring of the substrate 21 and a capacitor, a selected region of the second and first interlayer insulating film 23 and 22 are etched to form a contact hole. Then, after a polysilicon layer is formed so that the contact hole can be buried to a certain depth, a contact layer 25 and a diffusion prevention film 26 are formed on the polysilicon layer and are then flatten. Thus, the internal of the contact hole is buried with a capacitor plug 24 by the polysilicon layer, the contact layer 25 formed on the capacitor plug 24, and the diffusion prevention film 26. Next, after an underlying electrode material is formed on the entire structure and is then patterned to form an underlying electrode 27, a dielectric film 28 and an upper electrode 29 are formed on the entire structure using BST, thereby completing manufacturing a capacitor.

As such, in the method of manufacturing a capacitor according to the second conventional method, when the dielectric film 28 is formed, in order to prevent from exposing the contact layer 25 and the metal/oxygen diffusion prevention film 26, there has been attempted that the contact layer 25 and the diffusion prevention film 26 are formed in a plug shape so that they are located only inside the contact hole. However, it is impossible to avoid a misalignment between the bottom electrode mask and the contact mask and therefore the diffusion prevention film plug is exposed. Therefore, there is a problem that the characteristic of leakage current after the BST dielectric film is formed is degraded.

SUMMARY OF THE INVENTION

It is therefore an object of the present invention to provide a method of manufacturing a capacitor in a semiconductor device, by which an underlying electrode can be formed to a desired height without a process of etching an underlying electrode wherein the process has a difficulty in manufacturing a stack-type capacitor using BST, and therefore a misalignment between a capacitor plug and an underlying electrode that can be generated upon etching of the underlying electrode can be prevented and directly contacting a metal/oxygen diffusion prevention film with a dielectric film are avoid, thereby preventing diffusion of oxygen when a dielectric film is formed.

In order to accomplish the above object, a method of manufacturing a capacitor in a semiconductor device according to the present invention is characterized in that it comprises the steps of forming a first interlayer insulating film on a semiconductor substrate in which an underlying structure is formed, etching a portion of the first interlayer insulating film in which a capacitor will be formed, and forming a first contact hole; forming a polysilicon layer on the entire structure including the first contact hole and then etching the polysilicon layer; sequentially forming an adhesive layer and a diffusion prevention film on the polysilicon layer and then flattening them to bury the first contact hole; sequentially forming a second interlayer insulating film and an $O_3$-PSG film on the entire structure in which a diffusion prevention film is formed and then removing a selection region of the $O_3$-PSG film and the second interlayer insulating film to form a second contact hole; forming an underlying electrode material on the entire structure in which the second contact hole is formed, sequentially removing the underlying electrode material on the $O_3$-PSG film and said $O_3$-PSG film, thereby completing an underlying electrode; and sequentially forming a dielectric film and an upper electrode on the entire structure in which the underlying electrode is formed.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

FIGS. 3A to 3G are cross-sectional views of a device for explaining a method of manufacturing a capacitor in a semiconductor device according to the present invention.

Figure 1:
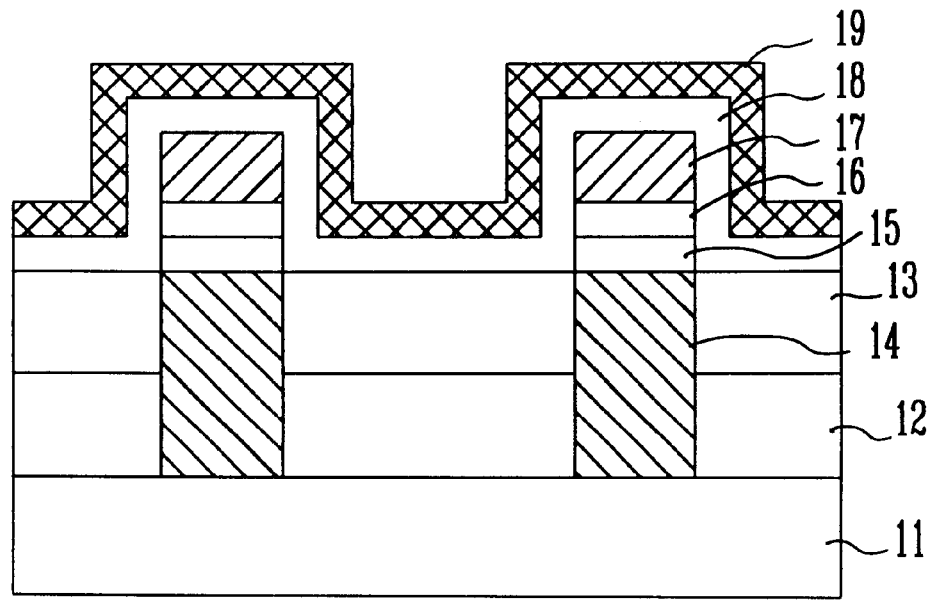
FIG. 1 is a cross-sectional view of a device for explaining a method of manufacturing a capacitor in a semiconductor device according to a first conventional method.
Figure 2:
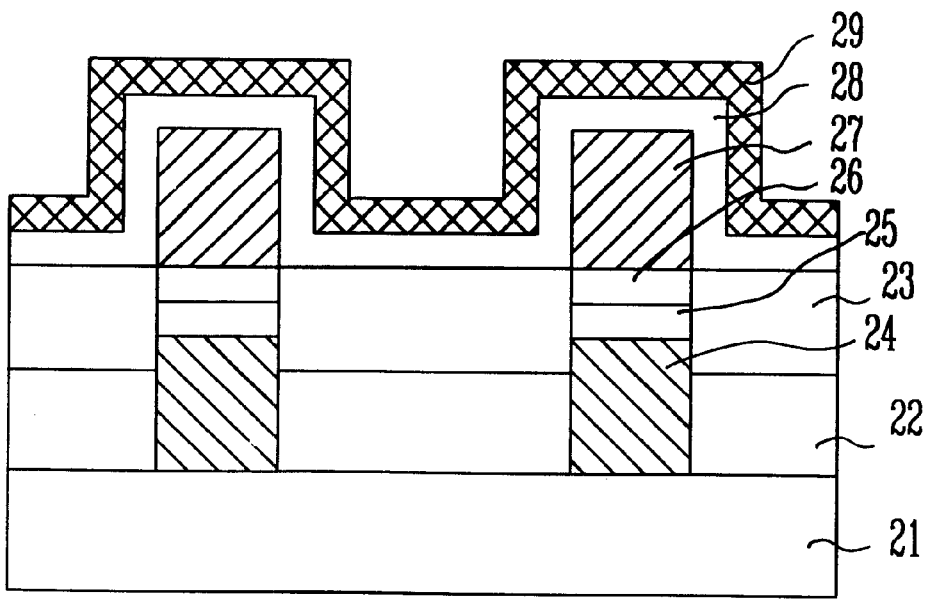
FIG. 2 is a cross-sectional view of a device for explaining a method of manufacturing a capacitor in a semiconductor device according to a second conventional method.
Figure 3A:
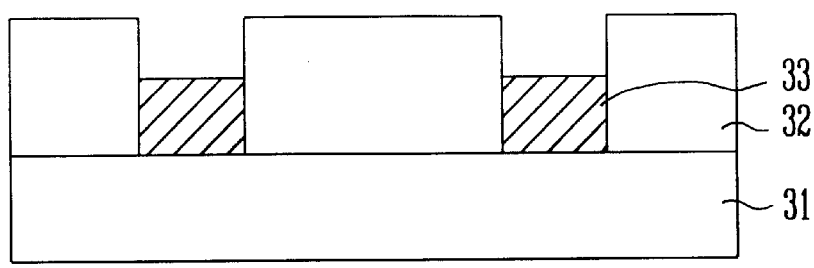
FIGS. 3A to 3G are cross-sectional views of a device for explaining a method of manufacturing a capacitor in a semiconductor device according to the present invention.

As shown in FIG. 3A, a first interlayer insulating film 32 is first formed on a substrate 31 in which an underlying structure is formed. Then, a first contact hole for vertical wiring of the substrate 31 and a capacitor is formed at a portion of the first interlayer insulating film 32 in which a capacitor will be formed. Next, a polysilicon layer 33 is formed and is then blanket-etched. Thereafter, the polysilicon layer 33 is formed in thickness of 500~5000 Å and is then blanket-etched so that it remains up to 500~3000 Å toward the inside direction from the boundary of the first contact hole, or a selective polysilicon is deposited to a desired height.

Figure 3B:
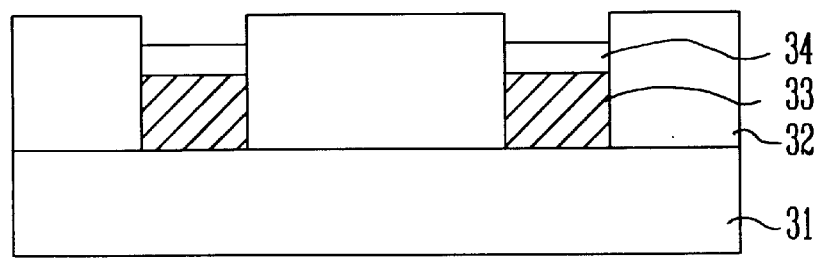

As shown in FIG. 3B, an adhesive layer 34 is formed on the polysilicon layer 33. The adhesive layer is formed, in such a manner that titanium or tantalum is deposited on the entire structure, annealing process is implemented to form a silicide film or a tantalum silicide film so that the device has an ohmic characteristic, and unreacted titanium or un-reacted tantalum is removed. At this time, titanium or tantalum is formed in thickness of 200~2000 Å using sputtering or chemical vapor deposition method, and the annealing process is implemented at the temperature of 550~950° C. for 30~120 seconds using rapid thermal nitridation (RTN).

Figure 3C:
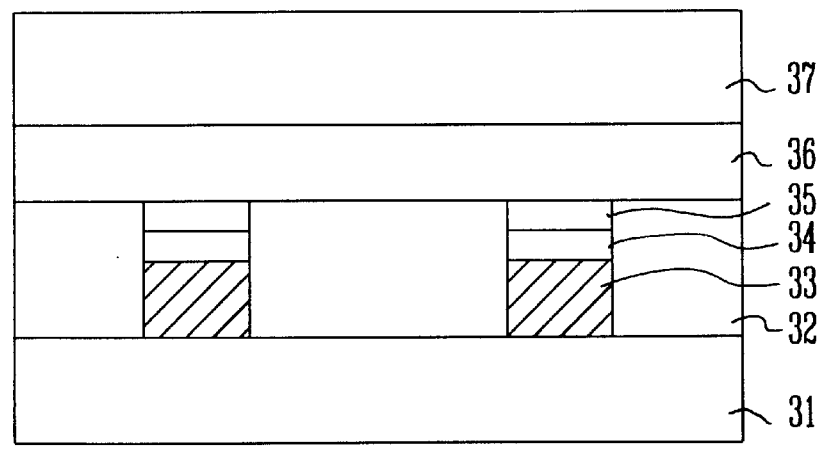

As shown in FIG. 3C, after a diffusion prevention film 35 is formed on the entire structure and is then flattened, a second interlayer insulating film 36 and an $O_3$PSG PSG film 37 are sequentially formed on the entire structure. At this time, the diffusion prevention film 35 is formed by depositing any one of titanium aluminum nitride (TiAlN), tantalum nitride (TaN), titanium nitride (TiN) and titanium silinteride (TiSiN) in thickness of 200~7000 Å, by sputtering or chemical vapor deposition method. Also, the flattening process is implemented using chemical mechanical polish process. Further, the second interlayer insulating film 36 is formed in thickness of 200~2000 Å and the $O_3$-PSG film 27 is formed in thickness of 200~7000 Å.

Figure 3D:
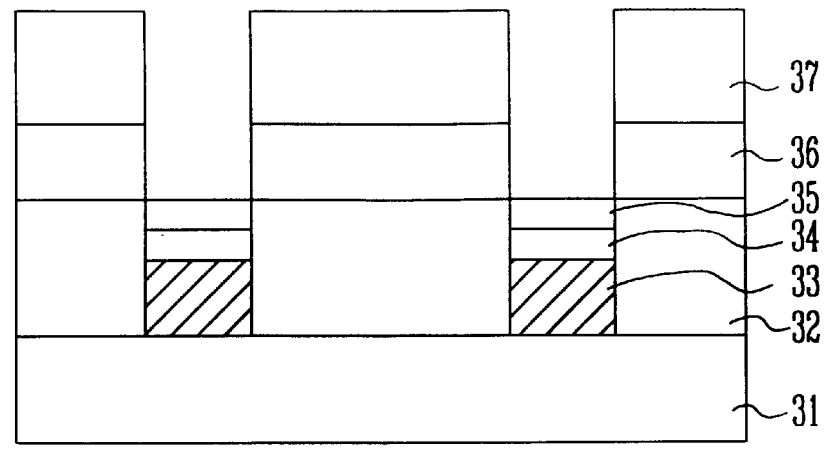

As shown in FIG. 3D, a portion of the $O_3$-PSG film 37 and the second interlayer insulating film 36 in which a capacitor will be formed is removed by performing photolithography and etching process using a mask to form a second contact hole.

Figure 3E:
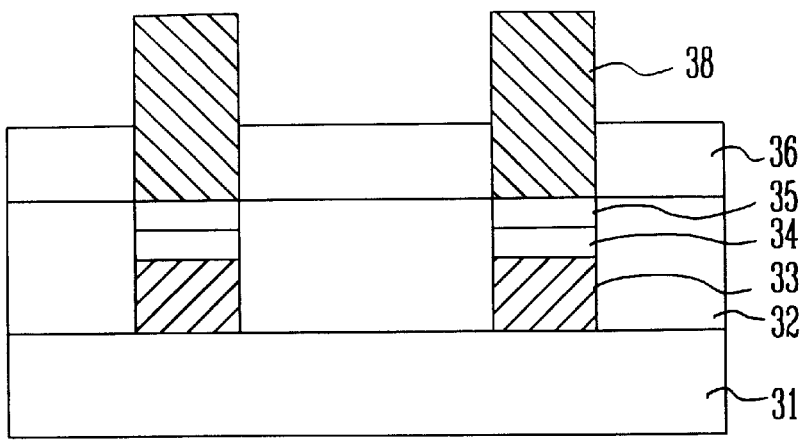

As shown in FIG. 3E, an underlying electrode material is formed on the entire structure in which a second contact hole is formed, and the underlying electrode material on the $O_3$-PSG film 37 and the $O_3$-PSG film 37 are sequentially removed to form an underlying electrode 38. At this time, the underlying electrode material may be formed using any one of platinum (Pt), ruthenium (Ru) and iridium (Ir). In particular, in case that the underlying electrode material is formed using platinum (Pt), it is deposited in thickness of 100~2000 Å using the reactive raw material consisted of a $MeCpPtMe_3$ (Methyl cylopentadienyl trimethyl platinum; $[(Ch_3)_3(Ch_{3C5}H_4)Pt])$ or the reactive raw material consisted of a (EtCP) $PtMe_3$(Ethyl-Cyclopentadienyl-Pt-Triethyl; $(C_2H_5C_5H_4)_2$) under the condition that the temperature is 250~550° C., the pressure is 0.1~5 Torr, and Ar, $O_2$ and $H_2$ gases of 0~500 sccm are supplied, by chemical vapor deposition method. Also. in the case that the underlying electrode material is formed using ruthenium (Ru), it is formed using $Ru(EtCP_2)$(EisEthylCyclopentadienyl-Ru; Ru $(C_2H_5C_5H_4)_2$) or $Ru(DPM)_3$(Ru-tridepivaloymethane; $Ru(C_{11}H_{19}O_2)_3$) or Ru-3(Tris(2,4Octanedionato)-Ru; $Ru(C_8H_{13}O_2)_3$) as a reactive raw material. Further, when the underlying electrode material on the $O_3$-PSG film 37 is removed, blanket etching or chemical mechanical polishing (CMP) method may be employed.

Figure 3F:
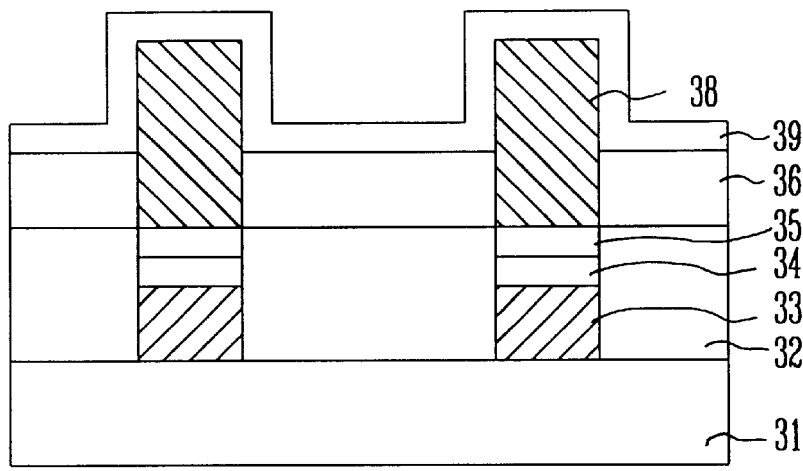
Figure 3G:
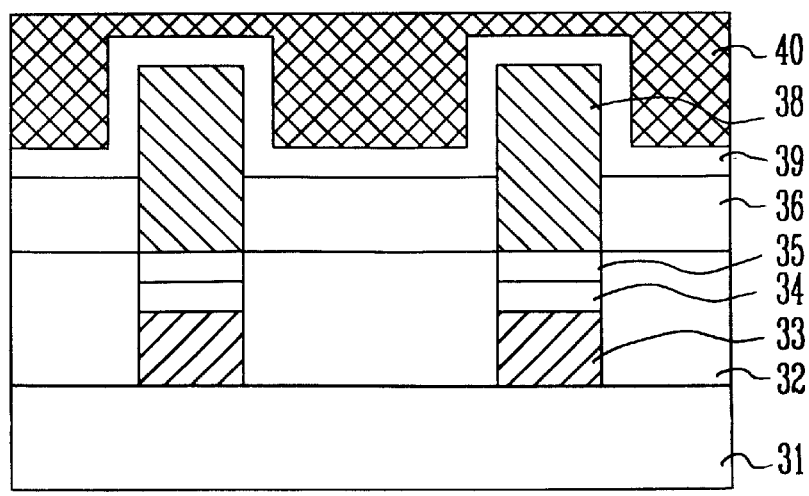

As shown in FIG. 3F, a dielectric film 39 is formed on the entire structure in which the underlying electrode 38 is formed. Next, as shown in FIG. 3G, an upper electrode 40 is formed on the dielectric film 39, thereby completing a capacitor.

In the above process, the dielectric film 39 may be formed by depositing thin film consisted of BST or a $SrTiO_3$ having high dielectric constant in thickness of 100~1000 Å at the temperature of 300~750° C. or may be formed as a double film by depositing BST in thickness of 100~1000 Å at the temperature of 300~550° C., implementing a subsequent annealing process and then depositing BST in thickness of 100~1000 Å at the temperature of 300~750° C. Also, the upper electrode 40 is formed by depositing any one of platinum (Pt), ruthenium dioxide ($RuO_2$) and iridium dioxide ($IrO_2$) in thickness of 500~2000 Å by chemical vapor deposition method, and then annealing the entire substrate at the temperature of 300~750° C. for 10~60 minutes under nitrogen atmosphere by physiognomy annealing. Further, after the dielectric film 39 and the upper electrode 40 are formed, they are experienced by rapid thermal process (RTP) at the temperature of 300~750° C. for 10~240 seconds under nitrogen/oxygen atmosphere as a subsequent annealing process.

The method of manufacturing a capacitor mentioned above includes sequentially forming an underlying structure, forming a first contact hole, forming a polysilicon layer, forming a contact layer within the first contact hole and forming a diffusion prevention layer, in order to improve the characteristic of a capacitor having a stack structure. Then, it includes forming a second contact hole, depositing an underlying electrode and then removing an insulating film to thus complete an underlying electrode of a stack structure. Next, a high dielectric thin film such as BST and an upper electrode are formed to complete manufacturing a capacitor. In the case that a capacitor of a stack structure is manufactured by this method, an underlying electrode can be formed by desired height because a process of etching the underlying electrode which could not be etched easily can be omitted, thereby increasing the effective surface area of a storage node in a capacitor. Also, a misalignment between the capacitor plug and the underlying electrode can be prevented. Further, oxygen diffusion when the BST thin film is deposited can be prevented since a direct contact of a metal/oxygen diffusion prevention film and a BST dielectric film can be avoided. Thus, the method according to the present invention can improve an electrical characteristic of a capacitor.

As mentioned above, the present invention sequentially forms a contact layer and a diffusion prevention film within a first contact hole for plug in a plug shape, forms a second contact hole using an oxide film, deposits an underlying electrode material and removes the oxide film to form an underlying electrode. Therefore, the present invention has the following effects: (1) the effective surface area of the underlying electrode can be increased since a process of etching for the underlying electrode which could not be etched easily can be omitted, (2) a misalignment between a capacitor plug and the underlying electrode which may generate upon etching the underlying electrode can be prevented and (3) diffusion of oxygen upon deposition of a BST thin film can be prevented since a direct contact of a metal/oxygen diffusion prevention film and a BST dielectric film can be avoided. As a result, the present invention can improve an electrical characteristic of a capacitor.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a capacitor in a semiconductor device, comprising:

forming a first interlayer insulating film on a semiconductor substrate, etching a portion of said first interlayer insulating film in which a capacitor will be formed, thereby forming a first contact hole;

forming a polysilicon layer on the entire structure including said first contact hole and subsequently etching the polysilicon layer;

forming sequentially an adhesive layer and a diffusion prevention film on said polysilicon layer and flattening said adhesive layer and said diffusion prevention film to bury said first contact hole;

forming sequentially a second interlayer insulating film and an $O_3$PSG film on the entire structure in which the diffusion prevention film is formed and removing a selection region of said $O_3$-PSG film and said second interlayer insulating film to form a second contact hole;

forming an underlying electrode material on the entire structure in which said second contact hole is formed, removing sequentially the underlying electrode material on said $O_3$-PSG film and said $O_3$-PSG film, thereby completing an underlying electrode; and forming sequentially a dielectric film and an upper electrode on the entire structure in which said underlying electrode is formed.

2. The method according to claim 1, wherein forming said polysilicon layer comprises forming said polysilicon layer with a thickness ranging from approximately 500 to approximately 5000 Å and blanket etching said polysilicon layer such that said the polysilicon layer has a thickness ranging from approximately 500 to approximately 3000 Å from the interface of said first contact hole to its inside.

3. The method according to claim 1, wherein said diffusion prevention film is formed in thickness ranging from approximately 200 to approximately 7000 Å, using at least one of titanium aluminum nitride, tantalum nitride, titanium nitride and titanium silinitride, and by a method chosen from sputtering and a chemical vapor deposition method.

4. The method according to claim 1, wherein said second interlayer insulating film is formed in a thickness ranging from approximately 200 to approximately 2000 Å.

5. The method according to claim 1, wherein said $O_3$-PSG film is formed in a thickness ranging from approximately 200 to approximately 7000 Å.

6. The method according to claim 1, wherein said underlying electrode is formed using at least one of platinum, ruthenium and iridium.

7. The method according to claim 1, wherein said dielectric film is formed by depositing at least one of BST and $SrTiO_3$ having high dielectric constant in a thickness ranging from approximately 100 to approximately 1000 Å at a temperature ranging from approximately 300 to approximately 750° C.

8. The method according to claim 1, wherein forming said dielectric film comprises forming said dielectric film and implementing subsequently a rapid thermal process at a temperature ranging from approximately 300 to approximately 750° C. for approximately 10 to approximately 240 seconds under a nitrogen/oxygen atmosphere.

9. The method according to claim 1, wherein forming said upper electrode comprises forming said upper electrode and implementing subsequently a rapid thermal process at a temperature ranging from approximately 300 to approximately 750° C. for approximately 10 to approximately 240 seconds under a nitrogen/oxygen atmosphere.

* * * * *